(12) United States Patent
Yoshinaga et al.

(10) Patent No.: US 11,047,929 B2
(45) Date of Patent: Jun. 29, 2021

(54) SIGNAL PROCESSING CIRCUIT AND MOTOR DRIVE SYSTEM

(71) Applicant: NIDEC CORPORATION, Kyoto (JP)

(72) Inventors: Masaki Yoshinaga, Kyoto (JP); Taro Amagai, Kyoto (JP); Akiko Ikeda, Kyoto (JP); Kengo Araki, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/836,952

(22) Filed: Apr. 1, 2020

(65) Prior Publication Data
US 2020/0319266 A1 Oct. 8, 2020

(30) Foreign Application Priority Data
Apr. 4, 2019 (JP) .............................. JP2019-071916

(51) Int. Cl.
*G01R 33/00* (2006.01)
*G01R 33/07* (2006.01)
*H01L 43/08* (2006.01)
*H03F 3/45* (2006.01)

(52) U.S. Cl.
CPC ......... *G01R 33/0017* (2013.01); *G01R 33/07* (2013.01); *H01L 43/08* (2013.01); *H03F 3/45659* (2013.01); *H03F 3/45973* (2013.01)

(58) Field of Classification Search
CPC ...... G01R 33/07; H01L 43/08; H03F 3/45659
See application file for complete search history.

(56) References Cited

U.S. PATENT DOCUMENTS

| 4,982,155 A * | 1/1991 | Ramsden ............... G01R 33/07 |
|---|---|---|
| | | 324/174 |
| 2009/0146598 A1* | 6/2009 | Hayashi .................... H02P 6/18 |
| | | 318/400.34 |
| 2017/0271999 A1* | 9/2017 | Yoshinaga .............. H02P 27/04 |

FOREIGN PATENT DOCUMENTS

JP 2012-47630 A 3/2012

* cited by examiner

*Primary Examiner* — Alvaro E Fortich
(74) *Attorney, Agent, or Firm* — Hauptman Ham, LLP (57) ABSTRACT

A signal processing circuit amplifies a signal of a magnetic sensor that changes according to the magnitude of a magnetic force. The signal of the magnetic sensor is a pair of signals inverted from each other with respect to a reference voltage. The signal processing circuit includes: a high-pass filter that performs a high-pass filtering process on the complementary signals from the magnetic sensor; a differential amplifier that receives the complementary signals having been subjected to the high-pass filtering process by the high-pass filter as a differential input signal and amplifies the differential input signal at a predetermined amplification factor based on the reference voltage; and a comparator that outputs a binary signal indicating a comparison result between an output signal of the differential amplifier and the reference voltage.

5 Claims, 12 Drawing Sheets

SIGNAL PROCESSING CIRCUIT AND MOTOR DRIVE SYSTEM

CROSS-REFERENCE TO RELATED APPLICATIONS

The present invention claims priority under 35 U.S.C. § 119 to Japanese Application No. 2019-071916 filed on Apr. 4, 2019, the entire content of which is incorporated herein by reference.

FIELD OF THE INVENTION

The present invention relates to a signal processing circuit and a motor drive system.

BACKGROUND

Conventionally, there has been known a circuit that cancels an output offset for a magnetic sensor, such as a Hall element, that changes according to the magnitude of a magnetic force. For example, there has been known an offset cancellation circuit of a Hall element configured to cancel an offset caused by a parasitic capacitance of a capacitor in a circuit.

Meanwhile, a Hall element is widely used as a magnetic sensor to detect a position of a rotor in a motor. A signal of the Hall element is amplified by a signal processing circuit, supplied to a microcontroller, and used for control of motor driving. Here, if an external magnetic field, such as a permanent magnet, is brought close to the motor, an offset occurs in the signal from the magnetic sensor, so that there is a problem that the signal of the Hall element is not accurately transmitted to the microcontroller. However, conventionally, a method for removing the offset caused by the external magnetic field has not been known.

SUMMARY

An exemplary embodiment of the present invention is a signal processing circuit that amplifies a signal of a magnetic sensor that changes according to the magnitude of a magnetic force, the signal of the magnetic sensor being complementary signals as a pair of signals inverted from each other with respect to a reference voltage, the signal processing circuit including: a high-pass filter that performs a high-pass filtering process on the complementary signals; a differential amplifier that receives the complementary signals having been subjected to the high-pass filtering process by the high-pass filter as a differential input signal and amplifies the differential input signal at a predetermined amplification factor based on the reference voltage; and a comparator that outputs a binary signal indicating a comparison result between an output signal of the differential amplifier and the reference voltage.

The above and other elements, features, steps, characteristics and advantages of the present disclosure will become more apparent from the following detailed description of the preferred embodiments with reference to the attached drawings.

DETAILED DESCRIPTION

Hereinafter, a motor drive system which is an embodiment of a drive system of the present invention will be described.

Hereinafter, an embodiment of a motor drive system of the present invention will be described with reference to the drawings.

Figure 1:
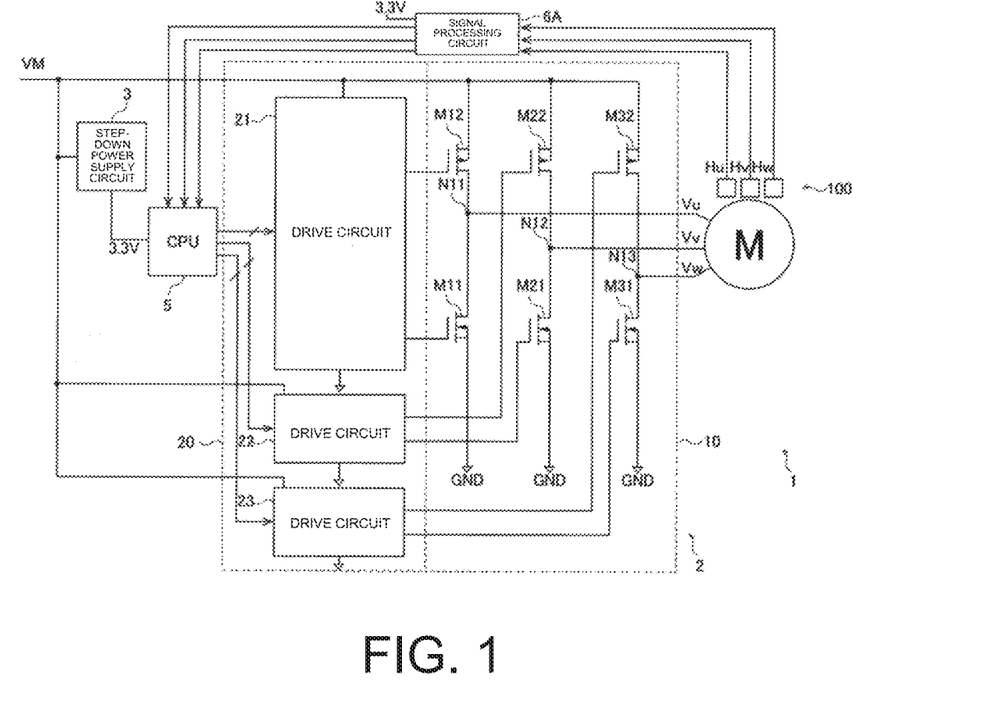
FIG. 1 is a diagram showing a system configuration of a motor drive system according to a first embodiment.

FIG. 1 is a diagram showing a system configuration of a motor drive system 1 according to the embodiment. The motor drive system 1 includes an inverter device 2, a step-down power supply circuit 3, a central processing unit (CPU) 5, and a three-phase AC motor M. The CPU 5 is an example of a microcontroller.

The inverter device 2 includes a three-phase voltage generation unit 10 and a drive circuit group 20, generates three-phase AC power, and supplies the three-phase AC power to a three-phase AC motor M. The three-phase AC motor M is provided with a Hall element group 100 for each phase for detecting a position of a rotor.

In the following description, a voltage of a node or a terminal in a circuit means a potential with a ground potential GND (hereinafter, referred to as a "GND potential") as a reference. For example, the highest potential in the inverter device 2 is a power supply potential VM, but the GND potential may be regarded as 0 V, and accordingly, is also referred to as "power supply voltage VM" as appropriate.

The step-down power supply circuit 3 reduces the power supply voltage VM to a predetermined voltage (+3.3 V in the present embodiment) required for the operation of the CPU 5, and supplies the power supply voltage VM to the CPU 5.

The CPU 5 supplies a pulse signal having an amplitude of 3.3 V to each of drive circuits 21 to 23 of the drive circuit group 20. Each drive circuit converts the pulse signal from the CPU 5 to a signal level at which a MOS transistor in the three-phase voltage generation unit 10 can operate.

In FIG. 1, the drive circuits 21 to 23 respectively correspond to nodes N11 to N13 and correspond to output terminals of a drive circuit to be described below.

Hereinafter, the configuration of the inverter device 2 will be described in detail.

As shown in FIG. 1, the three-phase voltage generation unit 10 of the inverter device 2 includes NMOS transistors M11, M21, and M31 as low-side switches and PMOS transistors M12, M22, and M32 as high-side switches. Since the three-phase AC motor M may operate at 100% duty in some cases, the three-phase voltage generation unit 10 uses the high-side switch as the PMOS transistor.

In the present embodiment, the PMOS transistor M12 and the NMOS transistor M11 are provided for a U phase of three-phase AC power supplied to the three-phase AC motor M. The PMOS transistor M12 and the NMOS transistor M11 perform the switching operation to generate a U-phase voltage Vu which is a U-phase output voltage.

Similarly, the PMOS transistor M22 and the NMOS transistor M21 are provided for a phase of the three-phase AC power supplied to the three-phase AC motor M. The PMOS transistor M22 and the NMOS transistor M21 perform the switching operation to generate a V-phase voltage Vv which is a V-phase output voltage. The PMOS transistor M32 and the NMOS transistor M31 are provided for a W phase of the three-phase AC power supplied to the three-phase AC motor M. The PMOS transistor M32 and the NMOS transistor M31 perform the switching operation co generate a W-phase voltage Vw which is a W-phase output voltage.

Each of the NMOS transistors M11, M21, and M31 has a source set to the ground potential GND. Each of the PMOS transistors M12, M22, M32 has a source connected to the power supply voltage VP of the inverter device 2.

A common drain (the node N11) of the NMOS transistor M11 and the PMOS transistor M12 of the U phase is connected to one end of a U-phase winding (not shown) of the three-phase AC motor M. Similarly, a common drain (the node N12) of the NMOS transistor M21 and the PMOS transistor M22 of the V phase is connected to one end of a V-phase winding (not shown) of the three-phase AC motor M, and a common drain (the node N13) of the NMOS transistor M31 and the PMOS transistor M32 of the W phase is connected to one end of a W-phase winding (not shown) of the three-phase AC motor M.

The Hall element group 100 includes three Hall elements Hu, Hv, and Hw that detect a position of the rotor of the three-phase AC motor M. In the following description, when the three Hall elements Hu, Hv, and Hw, will be simply described as "Hail elements H" When being commonly referred to. The Hall element H is an element that converts the magnitude of a magnetic force that changes according to the rotation of a rotor magnet of the three-phase AC motor M into an electric signal.

As will be described below, signals of the three Hall elements Hu, Hv, and Hw are complementary signals each of which is a pair of signals inverted from each other with respect to a reference voltage, and are sine wave signals having a phase difference of 120 degrees in order.

A signal processing circuit 6A amplifies a signal of each Hall element H, converts the signal into a pulse signal having an amplitude of 3.3 V, and supplies the pulse signal to the CPU 5. Details of the signal processing circuit 6A will be described below. A duty ratio of the pulse signal supplied from the signal processing circuit 6A is usually 50%, and does not largely deviate from 50%.

The CPU 5 determines the duty ratio of the pulse signal supplied to the driving circuits 21 to 23 of the drive circuit group 20 based on the pulse signal to be supplied by the signal processing circuit 6A, and supplies the pulse signal with the determined duty ratio to each drive circuit. The amplitude of the pulse signal to be supplied to each drive circuit is 3.3 V, which is the same as an operating voltage of the CPU 5.

Each drive circuit of the drive circuit group 20 converts a level of the pulse signal having the amplitude of 3.3 V and supplied from the CPU 5. The drive circuit 21 inputs the level-converted pulse signal to each gate of the NMOS transistor M11 and PMOS transistor M12 of the U phase. The drive circuit 22 inputs the level-converted pulse signal to each gate of the NMOS transistor M21 and PMOS transistor M22 of the V phase. The drive circuit 23 inputs the level-converted pulse signal to each gate of the NMOS transistor M31 and PMOS transistor M32 of the W phase.

The operations of the NMOS transistors M11, M21, and M31 as the low-side switches and the PMOS transistors M12, M22, and M32 as the high-side switches are controlled by the pulse signals whose levels have been converted by the drive circuits 21, 22, and 23, respectively.

Hereinafter, the configuration of the signal processing circuit 6A of the present embodiment will be described in detail, but a reference circuit 6R, which is a signal processing circuit for reference, will be described with reference to FIGS. 2 and 3 first for the purpose of comparison with the signal processing circuit 6A.

Figure 2:
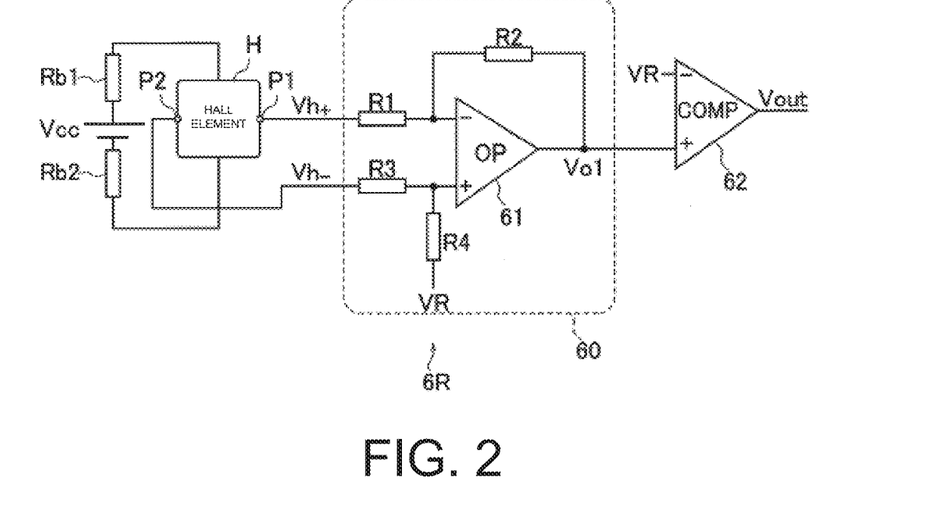
FIG. 2 is a circuit diagram of a reference circuit.

FIG. 2 is a circuit diagram of the reference circuit 6R. FIGS. 3A and 3B are timing charts showing the operation of the reference circuit 6R. Although a signal processing circuit for one Hall element H in the Hall element group 100 is shown in the reference circuit 6R shown in FIG. 2, a signal processing for the Hall element H of another phase is the same.

As shown in FIG. 2, in order to generate a predetermined bias voltage or bias current for the Hall element H, resistors Rb1 and Rb2 are provided for a power supply voltage Vcc. A pair of complementary signals, that is, a Hall element signal Vh+ and a Hall element signal Vh− are output from output terminals P1 and P2 of the Hall element H, respectively. The Hall element signal Vh+ and the Hall element signal Vh− are sine wave signals having phases opposite to each other with respect to the reference voltage VR.

In the example of the present embodiment, the reference voltage VR is a voltage of a half level of the power supply voltage Vcc.

The reference circuit 6R includes a signal amplifier 60 and a comparator 62. The signal amplifier 60 includes a differential amplifier 61 and resistors R1 to R4.

The differential amplifier 61 is a differential amplifier, amplifies the signals Vh+ and Vh− of the Hall element H, and outputs a signal of a voltage Vol. The resistor R1 is provided between the output terminal P1 of the Hall element H and an inverting input terminal of the differential amplifier 61, and the resistor R3 is provided between the output terminal P2 of the Hall element H and a non-inverting input terminal of the differential amplifier 61.

A feedback resistor R2 is provided between the inverting input terminal and an output terminal of the differential amplifier 61. One end of the resistor R4 is connected to the non-inverting input terminal of the differential amplifier 61, and the other end of the resistor R4 is set to the reference voltage VR.

Typically, the signal amplifier 60 is set such that R2/R1=R4/R3, and this value becomes an amplification factor (gain) of the signal amplifier 60.

The comparator 62 compares the signal (output voltage Vo1) amplified and output by the signal amplifier 60 and the reference voltage VR, and outputs a binary pulse signal (output voltage Vout) indicating a result of the comparison. This pulse signal is supplied to the CPU 5.

Figure 3A:
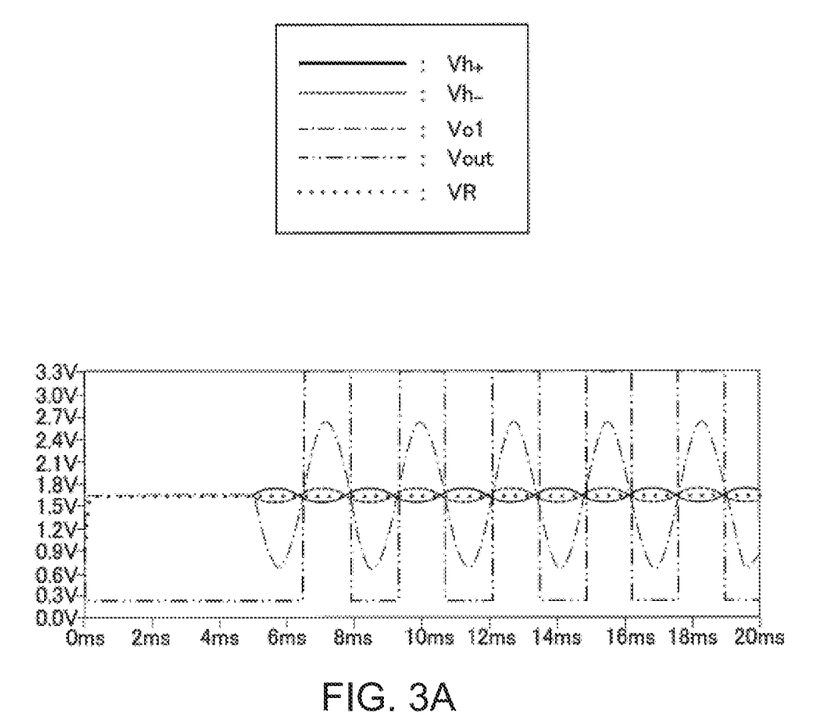
FIGS. 3A and 3B are timing charts showing the operation of the reference circuit.
Figure 3B:
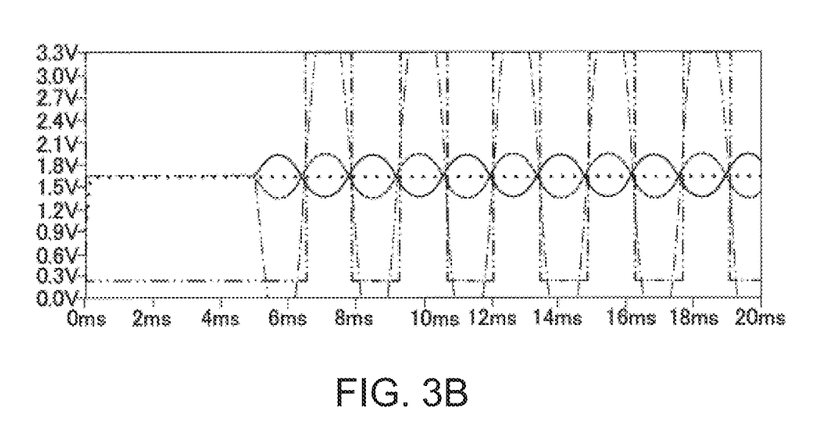

FIGS. 3A and 3B show simulation results of waveforms of the Hall element signals Vh+ and Vh−, the output voltage Vo1 of the differential amplifier 61, the output voltage Vout of the comparator 62, and the reference voltage VR. FIG. 3A shows a case where the amplitude of the Hall element signal is 0.1 Vp-p and the gain of the signal amplifier 60 is five times. FIG. 3B shows a case where the amplitude of the Hall element signal 0.3 Vp-p and the gain of the signal amplifier 60 is five times.

When the output voltage Vo1 is Vp-p and exceeds the power supply voltage Vcc (3.3 V) as shown in FIG. 3B, the output voltage Vo1 clamped and does not become a sine wave. In both the cases of FIGS. 3A and 3B, the output voltage Vout has a pulse waveform with a 50% duty.

FIGS. 3A and 3B show the cases where the reference circuit 6R operates normally. However, when there is a magnetic field other than a detection target outside, an offset occurs in the Hall element signals Vh+ and Vh−, so that the output voltage Vout does not have a 50% duty. This point is shown in FIG. 4.

Figure 4:
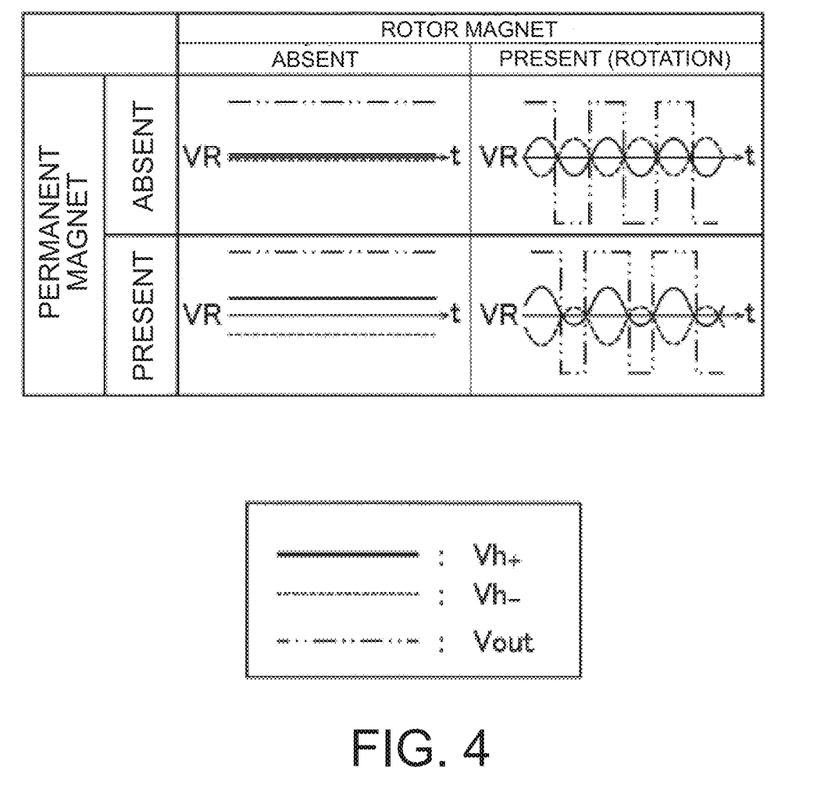
FIG. 4 is a view for describing ac effect of an external magnetic field on a signal of a Hall element.

FIG. 4 is a view showing how the Hall element signals Vh+ and Vh− and the output voltage Vout (pulse) of the reference circuit 6R change between a case where there is no magnet (permanent magnet) near the three-phase AC motor M and a case where there is a magnet. If the magnet is absent near the three-phase AC motor M, Hall element signals Vh+ and Vh− of sine waves in which cross points with the reference voltage VR are present at constant intervals are generated in accordance with the rotation of a rotor magnet, thereby obtaining a pulse waveform having the output voltage Vout of the reference circuit 6R with a 50% duty.

On the other hand, if the magnet is present near the three-phase AC motor M, cross points of the Hall element signals Vh+ and Vh− with the reference voltage VR are not present at constant intervals in accordance with the rotation of the rotor magnet due to an offset component caused by the corresponding magnetic field, and thus, the output voltage Vout of the reference circuit 6R does not have a pulse waveform with a 50% duty.

Next, the signal processing circuit 6A of the present embodiment will be described with reference to FIGS. 5 to 7.

Figure 5:
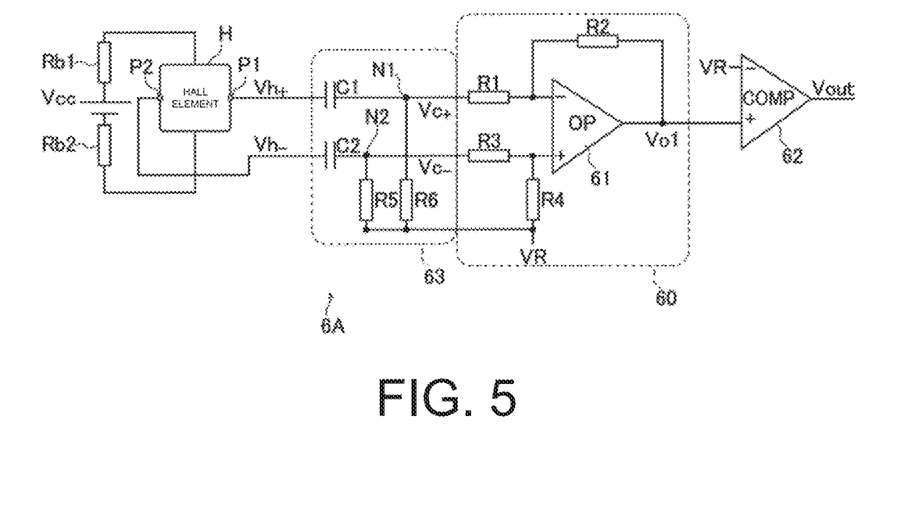
FIG. 5 is a circuit diagram of a signal processing circuit according to the first embodiment.

FIG. 5 is a circuit diagram of the signal processing circuit 6A of the present embodiment. FIGS. 6A and 6B are timing charts showing the operation of the reference circuit 6R and the signal processing circuit 6A of the present embodiment. FIG. 7 is a timing chart showing the operation of the signal processing circuit 6A of the present embodiment.

In view of the above-described problem of the reference circuit 6R, the signal processing circuit 6A of the present embodiment is configured to cancel an offset component caused by an external magnetic field even when there is a magnetic field other than the detection target outside. As shown in FIG. 5, the signal processing circuit 6A of the present embodiment is different from the reference circuit 6R (FIG. 2) in terms that a high-pass filter 63 is added at a previous stage of the signal amplifier 60.

The high-pass filter 63 includes capacitors C1 and C2 and resistors R5 and R6. One end of the capacitor C1 is connected to the output terminal P1, and the other end of the capacitor C1 is connected to one end of the resistor R1 (the end opposite to the inverting input terminal of the differential amplifier 61). One end of the capacitor C2 is connected to the output terminal P2, and the other end of the capacitor C2 is connected to one end of the resistor R3 (the end opposite to the non-inverting input terminal of the differential amplifier 61). One end of the resistor R6 is connected to a node between the capacitor C1 and the resistor R1, and the other end of the resistor R6 is set to the reference voltage VR. One end of the resistor R5 is connected to an intermediate node between the capacitor C2 and the resistor P3, and the other end of the resistor R5 is set to the reference voltage VR.

In FIG. 5, a voltage at a node N1 between the capacitor C1 and the resistor R1 (that is, the node N1 at the input terminal of the signal amplifier 60) is set as a voltage Vc+, and a voltage at a node N2 between the capacitor C2 and the resistor R3 (that is, the node N2 at the input terminal of the signal amplifier 60) is defined as a voltage Vc−.

In the present embodiment, the capacitor C1 and the resistor R6, and the capacitor C2 and the resistor R5 each constitute a CR integration circuit, and a high-pass filtering process is performed on the Hall element signal Vh+ and the Hall element signal Vh−. With this high-pass filtering process, components caused by the external magnetic field of relatively low frequency components included in the Hall element signals Vh+ and Vh− are removed from the voltages Vc+ and Vc−.

Figure 6A:
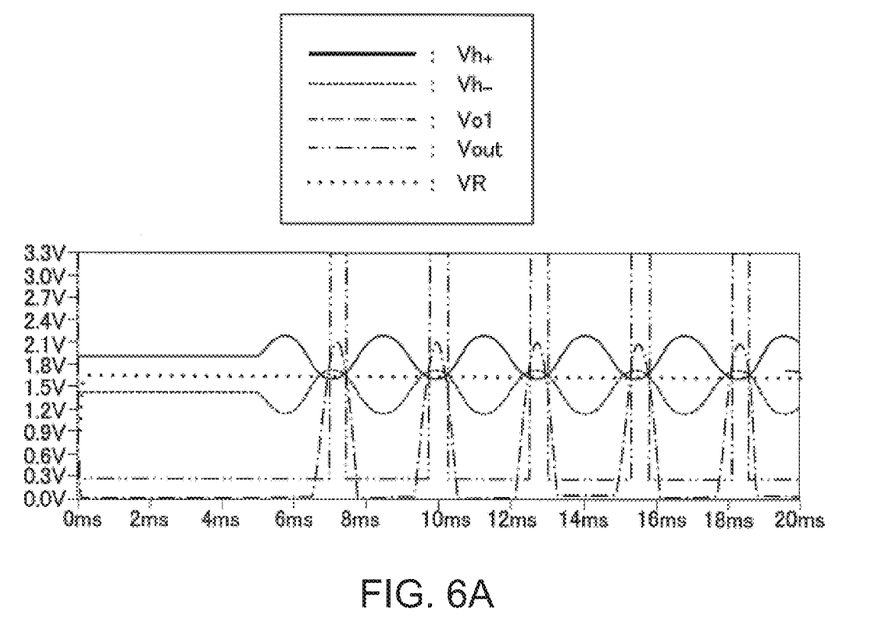
FIGS. 6A and 6B are timing charts showing the operation of the reference circuit and the signal processing circuit of the first embodiment.
Figure 6B:
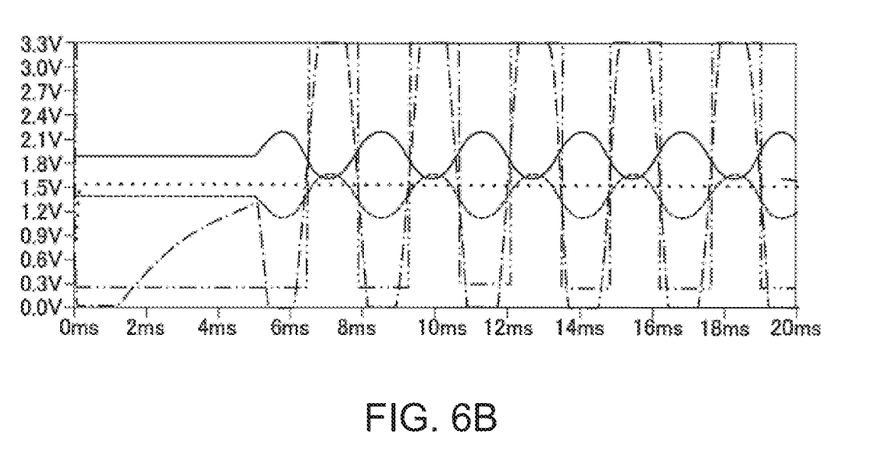

FIGS. 6A and 6B show simulation results of waveforms of the Hall element signals Vh+ and Vh−, the output voltage Vo1 of the differential amplifier 61, the output voltage Vout of the comparator 62, and the reference voltage VR. FIG. 6A shows the waveform in the case of the reference circuit 6R (FIG. 2), and FIG. 6B shows the waveform in the case of the signal processing circuit 6A of the present embodiment. Note that the signal processing circuit 6A is set such that C1=C2=0.1 µF and R5=R6=47 kΩ.

In all the cases, it is assumed that the Hall element signals Vh+ and Vh− have an offset of 0.5 V (DC component) due to the external magnetic field.

As shown in FIG. 6A, the offset component is not removed in the reference circuit 6R, and thus, the interval between the cross points of the Hall element signals Vh+ and Vh− with the reference voltage VR does not become constant, and the duty ratio of the output voltage Vout does not become 50%.

Figure 7:
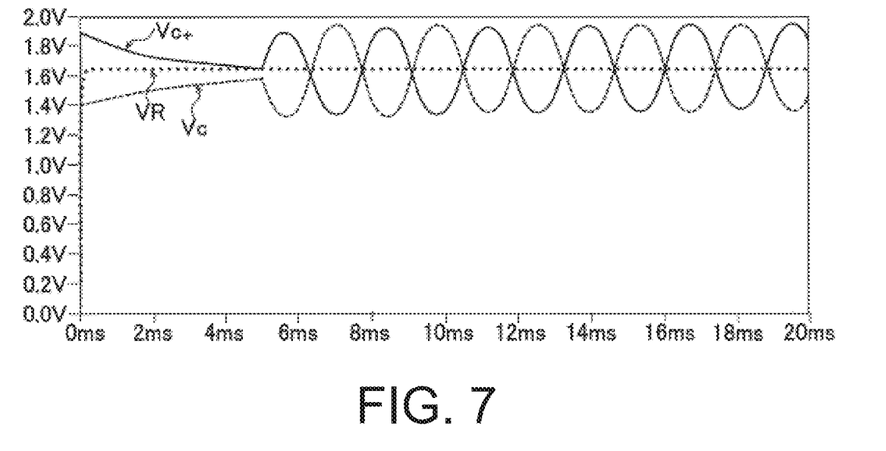
FIG. 7 is a timing chart showing the operation of the signal processing circuit of the first embodiment.

On the other hand, in the signal processing circuit 6A, the Hall element signals Vh+ and Vh− are the same as those in the case of FIG. 6A, and an interval between cross points of the voltages Vc+ and Vc− with the reference voltage VR observed at the nodes N1 and N2 is substantially constant around 20 ms after the activation as a result of removing the offset of the DC component by the high-pass filter 63 as shown in FIGS. 6B and 7. As a result, it is understood that a duty ratio of the output voltage Vout (see FIG. 6B) is almost 50%.

As described above, the motor drive system 1 of the present embodiment is characterized by providing the high-pass filter 63 at the previous stage of the signal amplifier 60 in the signal processing circuit 6A processing the signal from the Hall element H. Since the high-pass filter 63 is provided, the offset of the output voltage of the Hall element H caused particularly by the external magnetic field of the DC component can be removed.

Next, a motor drive system according to a second embodiment will be described.

Only a signal processing circuit is different from the motor drive system 1 of the first embodiment in a motor drive system according to each of the following embodiments, and thus, only the signal processing circuit will be described.

Figure 8:
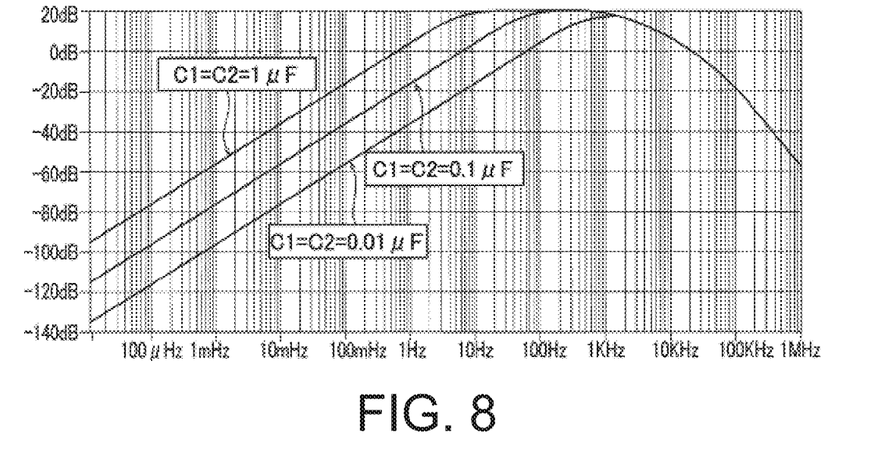
FIG. 8 is a view showing frequency characteristics of the signal processing circuit according to the first embodiment.
Figure 9:
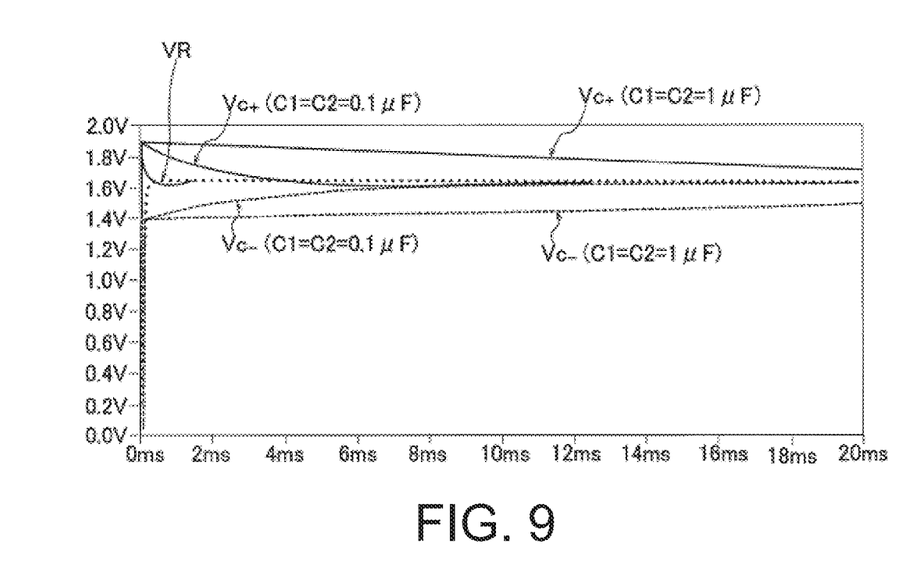
FIG. 9 is a view showing transient characteristics of the signal processing circuit according to the first embodiment.

In the signal processing circuit 6A of the first embodiment shown in FIG. 5, frequency characteristics and transient characteristrics of the output signal Vol of the signal amplifier 60 are affected by the capacitors C1 and C2 and the resistors R5 and R6. FIGS. 8 and 9 show the frequency characteristics of the output signal Vol of the signal amplifier 60 when capacitance values of the capacitors C1 and C2 are changed by setting both the resistors R5 and R6 to 47 k$\Omega$, for example, and the transient characteristics of the voltages Vc+ and Vc− of the nodes N1 and N2 at input terminals of the signal amplifier 60, respectively.

When C1=C2=C and R5=R6=R, a cutoff frequency f of the output signal Vol of the signal amplifier 60 is represented by $1/(2\pi CR)$, and the cutoff frequency f increases as the value of C decreases as shown in FIG. 8. Typically, each band of the Hall element signals Vh+ and Vh− is about 360 Hz, but a gain in this band is not reduced and is greatly attenuated in a lower frequency band.

In the transient characteristics as shown in FIG. 9, the larger the value of C is, the larger a time constant until the offset caused by the external magnetic field disappears becomes.

Figure 10A:
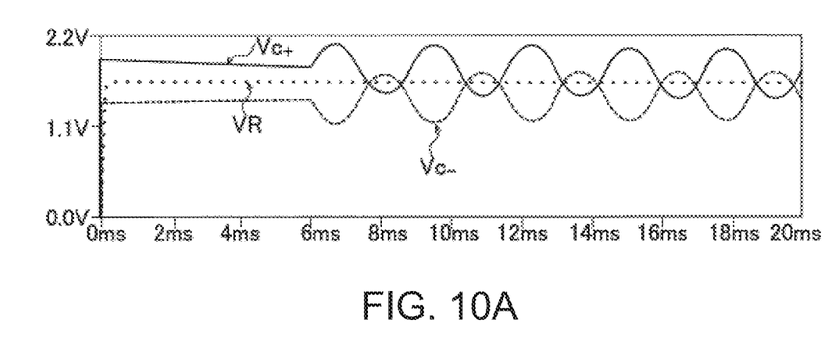
FIGS. 10A and 10B are timing charts showing the operation when a parameter of an element is changed in the signal processing circuit according to the first embodiment.
Figure 10B:
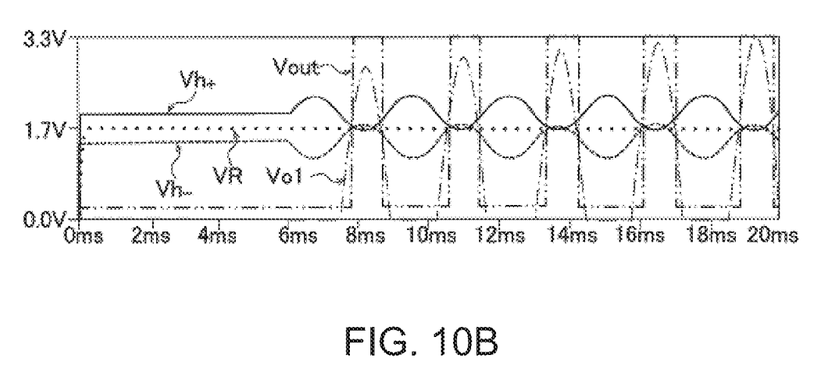

For example, the characteristics of the signal processing circuit 6A of the first embodiment shown in FIGS. 6A to 7 are obtained when C1=C2=0.1 µF and R5=R6=47 k$\Omega$ are set. When C1=C2=1 µF and R5=R6=47 k$\Omega$ are set, the characteristics of the signal processing circuit 6A are obtained as shown in FIGS. 10A and 10B. FIG. 10A shows simulation results of waveforms of the voltages Vc+ and Vc− of the nodes N1 and N2 at the input terminals of the signal amplifier 60 and the reference voltage VR, and FIG. 10B shows simulation results of waveforms of the Hall element signals Vh+ and Vh−, the output voltage Vol of the differential amplifier 61, the output voltage Vout of the comparator 62, and the reference voltage VR.

As shown in FIG. 10, it is understood that the offset caused by the external magnetic field is not removed from the voltages Vc+ and Vc−, and the duty ratio of the output voltage Vout of the signal processing circuit 6A is not 50% in an initial period after the activation.

In other words, the frequency characteristics of the output signal Vol become flat characteristics up to a low frequency side (that is, the cutoff frequency is present closer to the lower frequency side) by increasing the value of C, but the time constant in the transient characteristics increases, so that it takes time to eliminate the offset caused by the external magnetic field. The same applies when the value of R is changed. In other words, the frequency characteristics of the output signal Vol become flat characteristics up to the low frequency side by increasing the value of R, but the time constant in the transient characteristics increases, so that it takes time to eliminate the offset caused by the external magnetic field.

From the viewpoint described above, a signal processing circuit 6B of the present embodiment is configured to remove the offset caused by the external magnetic field faster while setting the cutoff frequency of the high-pass filter 63 to be closer to the low frequency side.

Figure 11:
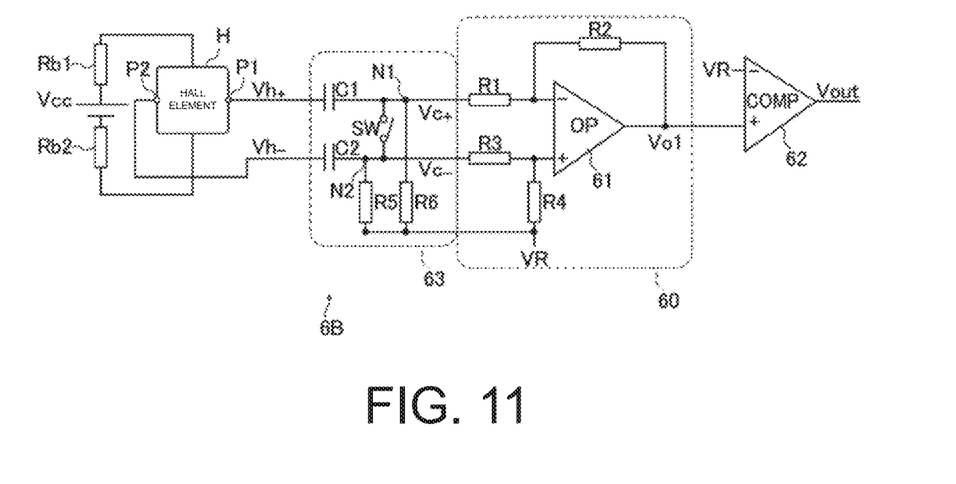
FIG. 11 is a circuit diagram of a signal processing circuit according to a second embodiment.

FIG. 11 shows a specific circuit configuration. FIG. 11 is a circuit diagram of the signal processing circuit 6B of the present embodiment.

As compared with the signal processing circuit 6A of the first embodiment (see FIG. 5), the signal processing circuit 6B shown in FIG. 11 has a difference that a switching device sw that sets conduction or non-conduction between the nodes N1 and N2 is provided. That is, the signal processing circuit 6B of the present embodiment is provided with the switch sw that sets a conductive state or a non-conductive state between a pair of tines transmitting the complementary signals Vh+ and Vh− output from the Hall element H. The CPU 5 (see FIG. 1) controls the switch sw such that the conductive state is set between the pair of lines transmitting the signals Vh+ and Vh− only during a predetermined time after the activation.

Figure 12A:
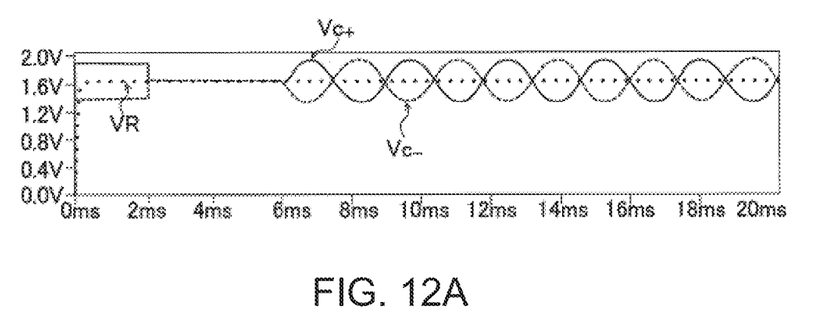
FIGS. 12A and 12B are timing charts showing the operation of the signal processing circuit of the second embodiment.
Figure 12B:
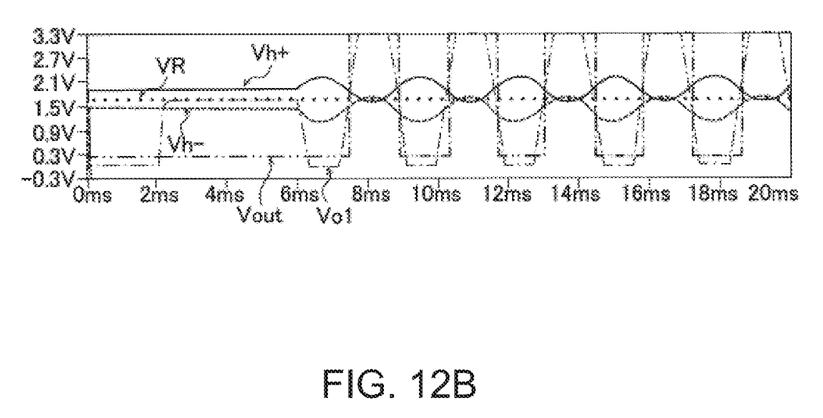

For example, FIGS. 12A and 12B show the operation of the signal processing circuit 6B of the present embodiment when the switch sw is closed for 2 ms from 2 ms to 4 ms after the activation.

FIG. 12A shows simulation results of waveforms of the voltages Vc+ and Vc− of the nodes N1 and N2 at input terminals of the signal amplifier 60 and the reference voltage VR in the signal processing circuit 6B, and FIG. 12B shows simulation results of waveforms of the Hall element signals Vh+ and Vh−, the output voltage Vol of the differential amplifier 61, the output voltage Vout of the comparator 62, and the reference voltage VR.

FIGS. 12A and 12B show a case where C1=C2=1 µF similarly to FIGS. 10A and 10B. As understood by comparing FIGS. 12A and 12B with FIGS. 10A and 10B, the offset caused by the external magnetic field is removed from the voltages Vc+ and Vc− of the nodes N1 and N2 after 6 ms since the activation in the signal processing circuit 6B of the present embodiment. As a result, it is understood that the duty ratio of the output voltage Vout becomes 50% from an early stage after 6 ms since the activation.

The signal processing circuit 6B of the present embodiment is particularly advantageous when it is desired to increase the transient response.

Next, a motor drive system according to a third embodiment will be described.

Figure 13:
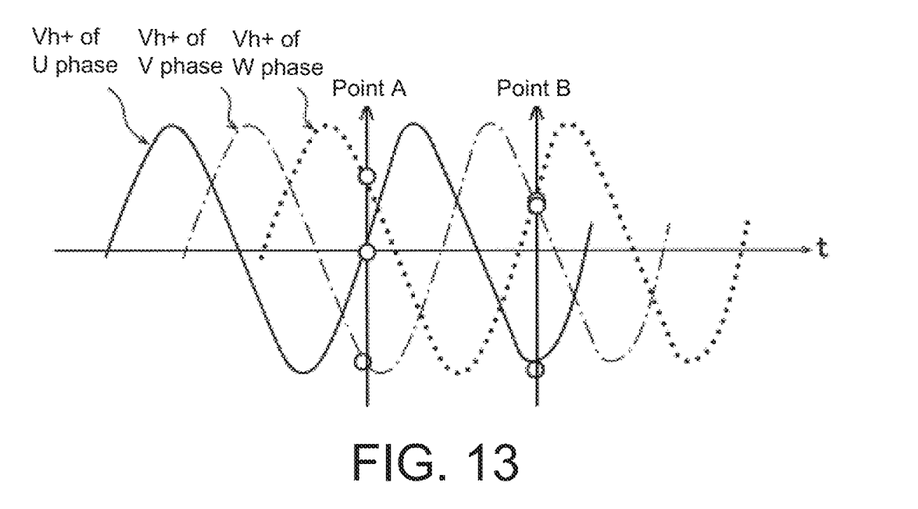
FIG. 13 is a view showing a signal waveform of a Hall element of each phase of a three-phase AC motor.

In the motor drive systems according to the first and second embodiments, the offset voltage of the DC component caused by the external magnetic field is removed so that position information of each phase of the U phase, the V phase, and the W phase when the three-phase AC motor M is stopped is lost. For example, FIG. 13 shows signals Vh+ of the Hall elements H corresponding to the U phase, the V phase, and the N phase. In FIG. 13, the signal Vh+ of each phase differs depending on whether the motor is stopped at point A or point B, and information on the signal of the Hall element H at the time of the stop is also lost by removing the offset voltage of the DC component caused by the external magnetic field.

The position information of each phase when the three-phase AC motor M is stopped is obtained by acquiring the signals Vh+ and Vh− at the previous stage of the high-pass filter 63 and processing digital values of the acquired signals on software. On the other hand, a description will be given in the present embodiment regarding a configuration of the signal processing circuit that prevents the lost of information on the position of each phase during the stop of the motor without performing such processing on software.

Figure 14:
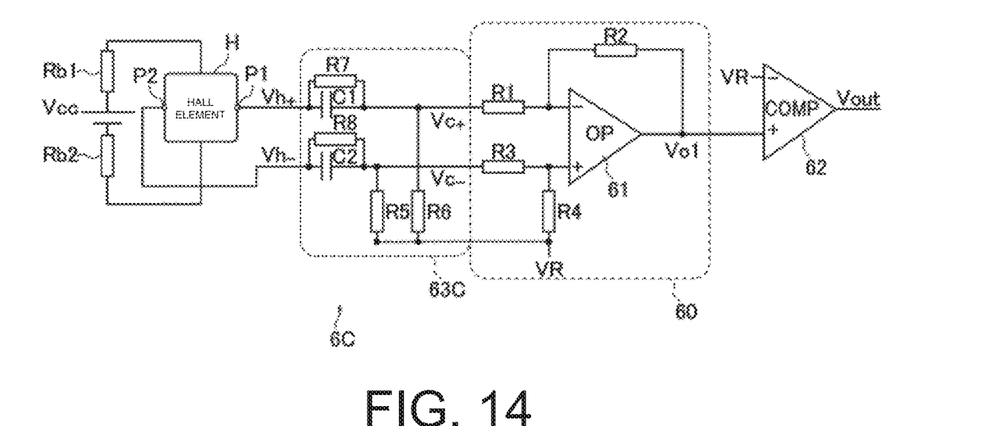
FIG. 14 is a circuit diagram of a signal processing circuit according to a third embodiment.

Hereinafter, a signal processing circuit 6C of the present embodiment will be described with reference to FIGS. 14 to 16. FIG. 14 is a circuit diagram of the signal processing circuit 65 of the present embodiment. FIGS. 15A to 15C are timing charts showing the operation of the signal processing circuit 6C of the present embodiment. FIG. 16 is a view showing frequency characteristics of the signal processing circuit 6C of the present embodiment.

As shown in FIG. 14, the signal processing circuit 65 of the present embodiment has a difference that a filter 63C is provided instead of the high-pass filter 63 as compared with the signal processing circuit 6A of the first embodiment (see FIG. 5). The filter 63C is different from the high-pass filter 63 in terms that resistors R7 and R8 are connected in parallel with the capacitors C1 and C2. Since the resistors R7 and R8 are provided, a DC component of a signal is attenuated and input to the signal amplifier 60, and a signal of a high frequency component during the operation of the motor is transmitted via the capacitors C1 and C2 since the capacitors C1 and C2 have low impedance.

Figure 15A:
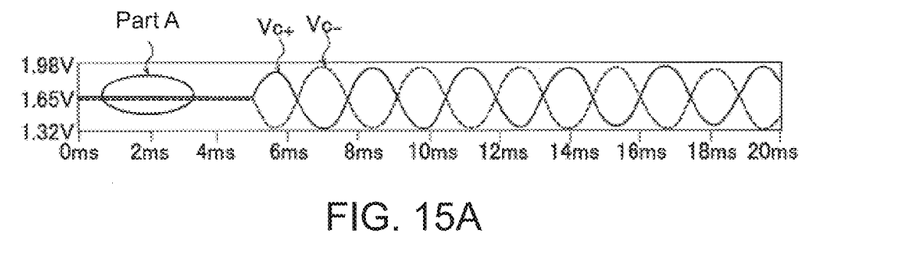
FIGS. 15A to 15C are timing charts showing the operation of the signal processing circuit of the third embodiment.
Figure 15B:
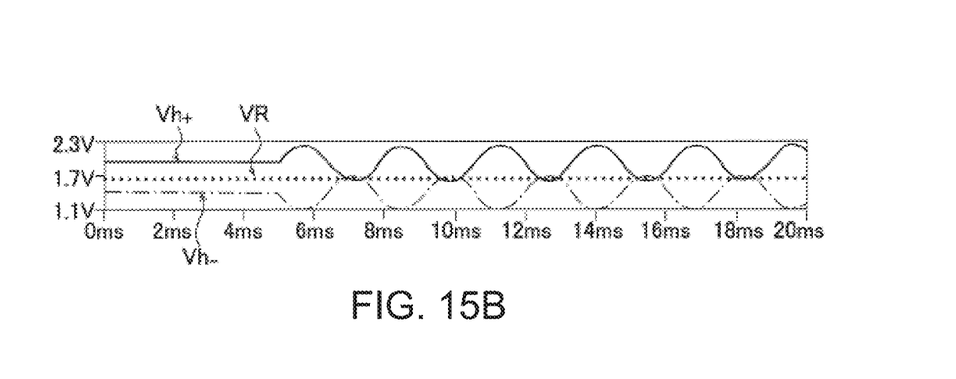
Figure 15C:
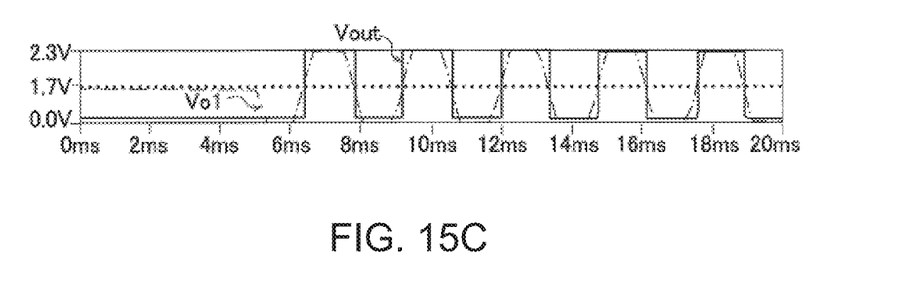
Figure 16:
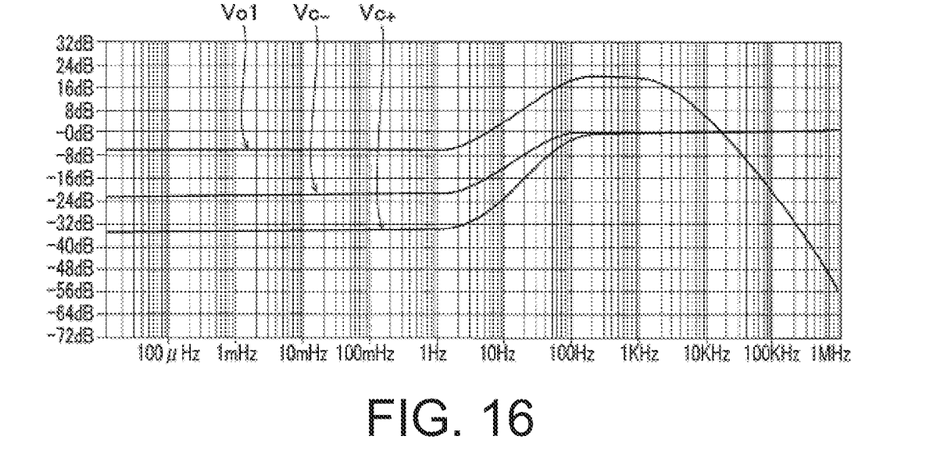
FIG. 16 is a view showing frequency characteristics of the signal processing circuit according to the third embodiment.

FIG. 15A shows simulation results of waveforms of the voltages Vc+ and Vc− of the nodes N1 and N2 at input terminals of the signal amplifier 60 in the signal processing circuit 6C. FIG. 15B shows simulation results of waveforms of the Hall element signals Vh+ and Vh− and the reference voltage VR in the signal processing circuit 6C. FIG. 15C shows simulation results of waveforms of the output voltage Vol of the differential amplifier 61, the output voltage Vout of the comparator 62, and the reference voltage VR in the signal processing circuit 6C.

As understood from the characteristics of the output voltage Vol shown in FIG. 16, the signal processing circuit 6C of the present embodiment does not attenuate the band (around 360 Hz) of the Hall element signals Vh+ and Vh−. On the other hand, as understood by comparison with the characteristics of the output voltage Vol of the first embodiment shown in FIG. 8, the signal processing circuit 6C of the present embodiment has such characteristics that a low frequency range is not attenuated as much as the signal processing circuit 6A.

For this reason, the DC component is not completely removed at the time of starting the three-phase AC motor M as shown in part A of FIG. 15A. Therefore, the CPU 5 can recognize the information on the position of each phase during the stop of the motor based on the output voltage Vout of the signal processing circuit 6C.

As described above, the embodiments of the signal processing circuit and the motor drive system according to the present invention have been described in detail. However, a scope of the present invention is not limited to the above embodiments. In addition, the above-described embodiments can be variously improved or changed within the scope not departing from a gist of the present invention. The technical matters described in each of the plurality of embodiments can be appropriately combined.

For example, the case where the on/off control of each driving MOS transistor of the three-phase voltage generation unit 10 is performed by 120-degree conduction based on position information of a Hall sensor has been described in the above-described embodiments, but the invention is not limited thereto. As an on/off control method of each driving MOS transistor, another energization control method such as 180-degree conduction may be applied.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A signal processing circuit that processes a signal of a magnetic sensor that changes according to a magnitude of a magnetic force, the signal of the magnetic sensor being complementary signals as a pair of signals inverted from each other with respect to a reference voltage, the signal processing circuit comprising:
   a high-pass filter that performs a high-pass filtering process on the complementary signals;
   a differential amplifier that receives the complementary signals having been subjected to the high-pass filtering process by the high-pass filter as a differential input signal and amplifies the differential input signal at a predetermined amplification factor based on the reference voltage; and
   a comparator that outputs a binary signal indicating a comparison result between an output signal of the differential amplifier and the reference voltage.

2. The signal processing circuit according to claim 1, further comprising:
   a switch that sets a conductive state or a non-conductive state between a pair of lines that transmit the complementary signals; and
   a control unit that controls the switch such that the pair of lines is set to the conductive state only during a predetermined time after activation.

3. The signal processing circuit according to claim 1, wherein the high-pass filter includes: a pair of capacitors provided on a pair of lines that transmit the complementary signals; and a pair of first resistors connected to the pair of capacitors, respectively, one end of each of the first resistors being connected to an input-side end of the differential amplifier among both ends of a corresponding capacitor, another end of each of the first resistors being set to the reference voltage.

4. The signal processing circuit according to claim 3, further comprising a pair of second resistors connected in parallel to each of the pair of capacitors.

5. A motor drive system comprising:
   the magnetic sensor that converts the magnitude of the magnetic force that changes according to rotation of a rotor magnet of a motor into an electric signal;
   the signal processing circuit according to claim 1 that processes the electric signal of the magnetic sensor;
   a controller that generates a control signal based on an output signal of the comparator of the signal processing circuit; and
   a motor drive unit that drives the motor based on the control signal.

* * * * *